United States Patent [19]
Oppermann et al.

[11] Patent Number: 5,519,241
[45] Date of Patent: May 21, 1996

[54] CIRCUIT STRUCTURE HAVING AT LEAST ONE BIPOLAR POWER COMPONENT AND METHOD FOR THE OPERATION THEREOF

[75] Inventors: Klaus-Guenter Oppermann, Holzkirchen; Michael Stoisiek, Ottobrunn, both of Germany

[73] Assignee: Siemens Aktiengesellschaft, Munich, Germany

[21] Appl. No.: 309,875

[22] Filed: Sep. 20, 1994

[30] Foreign Application Priority Data

Oct. 15, 1993 [DE] Germany ............... 43 35 298.7

[51] Int. Cl.$^6$ ................. H01L 27/02; H01L 23/48
[52] U.S. Cl. .............. 257/327; 257/337; 257/368; 257/379; 257/539
[58] Field of Search ....................... 257/327, 335, 257/337, 341, 368, 378, 379, 536, 539

[56] References Cited

FOREIGN PATENT DOCUMENTS

| 0478004 | 4/1992 | European Pat. Off. . |
| 0594111 | 4/1994 | European Pat. Off. . |
| 2-78275 | 3/1990 | Japan . |

OTHER PUBLICATIONS

"Lateral Resurfed COMFET," Darwish et al. Electronics Letters, vol. 21, No. 12, pp. 519–520 (1984).
"Analysis and Characterization of the Segmented Anode LIGBT," Sin et al., IEEE Trans. on Electron. Dev., vol. 40, No. 7, Jul. 1993, pp. 1300–1305.
"A Performance Trade-Off for the Insulated Gate Bipolar Transistor: Buffer Layer Versus Base Lifetime Reduction," Hefner, Jr., et al., IEEE Trans. on Power Electronics, vol. PE-2, No. 3, Jul. 1987, pp. 194–206.
"A New Concept For A Non Punch Through IGBT With MOSFET Like Switching Characteristics," Miller et al., IEEE PESC, 1989, Record vol. 1, pp. 21–25.
"Numerical Experiment for 2500V Double Gate Bipolar Mode MOSFETs (DGIGBT) and Analysis for Large Safe Operating Area (SOA)," Nakagawa, PESC 1989 Record vol. I, Apr. 1988, pp. 84–90.
"Dual Gate MOS Thyristor (DGMOT)," Seki et al., Proc. of 5th, Int. Symp. on Power Semiconductor Devices and ICs (IEEE), pp. 159–164.
"Power Integrated Circuits," Amato et al., Philips Technical Review, vol. 44, Nos. 8–10, May 1989, pp. 310–320.
Patent Abstracts of Japan, vol. 16, No. 142, (E–1187), Publication No. JP 4002169 Jan. 7, 1992.
Patent Abstracts of Japan, vol. 16, No. 174, (E–1195), Publication No. JP 4018763 Jan. 22, 1992.
Patent Abstracts of Japan, vol. 16, No. 420 (E–1259), Publication No. JP 4144289 May 18, 1992.
Patent Abstracts of Japan, vol. 16, No. 166, (E–1193), Publication No. JP 4014263 Jan. 20, 1992.
Patent Abstracts of Japan, vol. 15, No. 375, (E–1114), Publication No. JP 3148873 Jun. 25, 1991.

*Primary Examiner*—Mark V. Prenty
*Attorney, Agent, or Firm*—Hill, Steadman & Simpson

[57] ABSTRACT

In a bipolar power component, for example an IGBT, having an emitter structure and a drift zone of the opposite conductivity type, the emitter structure is provided with a first contact and the drift zone is provided with a second contact. The first contact and the second contact are connected to a drivable resistor circuit such that, dependent on a control signal at the resistor circuit, the current through the power component optionally flows via the first contact and/or via the second contact to a third contact of the resistor circuit.

9 Claims, 5 Drawing Sheets

CIRCUIT STRUCTURE HAVING AT LEAST ONE BIPOLAR POWER COMPONENT AND METHOD FOR THE OPERATION THEREOF

BACKGROUND OF THE INVENTION

1. Field of the Invention

The present invention is directed to a circuit which includes at least one bipolar power component as well as to a method for operating such a circuit.

2. Description of the Prior Art

Many power components have a lightly doped drift zone that defines the high-voltage strength of the power component. In order to increase the conductivity of the lightly doped drift zone in the activated condition of the power component, an emitter structure is often provided in the drift zone. The drift zone and emitter structure form a pn-junction polarized in conducting direction that is traversed by the main current. In the activated condition, charge carriers are injected into the drift zone from this pn-junction.

A specific component of this type is the insulated gate bipolar transistor (IGBT), that, for example, is known from H. Dorwish et al., Electronics Letters, vol. 21, no. 12, pp. 519–520 (1984). This type of component is a high-voltage DMOS transistor wherein the main current flows through a pn-junction polarized in the conducting direction. The pn-junction is formed by an emitter structure that is surrounded by a lightly doped drift zone having the opposite conductivity type. IGBTs can be vertically or laterally realized in a silicon substrate. Lateral IGBTs are generally used for integration in an integrated circuit.

The conductivity modulation, i.e. the increase in the conductivity of the drift zone in the activated condition due to charge carriers injected from the pn-junction, in fact improves the conductivity of the IGBT in the activated condition; however, it also leads to a number of disadvantages in comparison to an equivalent DMOS transistor. By comparison to an equivalent DMOS transistor, an IGBT exhibits reduced blockability. The Output characteristic exhibits a threshold voltage caused by the pn-junction at the emitter structure. Since the IGBT has a pnpn sequence, it tends toward latching given a high current. The term latching means a thyristor-like behavior wherein the IGBT can no longer be controlled. Due to the charge carrier injection in the activated condition, poor turn-off behavior with respect to switching time and switching losses occur given the IGBT. Another disadvantage it is not possible to integrate a free running diode in the IGBT.

Various measures have been proposed (see, for example, J. K. O. Sin, IEEE Transaction on Electronic Devices, vol. 40 pp. 1300–1305 (1993); A. R. Hefner et al., IEEE Transactions on Power Electronics, vol. PE-2, pp. 194–206 (1987); G. Miller et al., IEEE, PESC, 1989, record volume I, pp. 21–25) in order to improve the properties of an IGBT. The turn-off behavior, for example, is improved by a local shunt at the pn-junction formed by emitter structure and drift zone. A resistor path is connected parallel to the pn-junction for that purpose. As long as the main current through the IGBT remains below a critical value defined by the conductance of the shunt, it flows through the shunt. A charge carrier injection from the emitter structure into the drift zone then does not occur. When, by contrast, the main current is higher that this crucial current, then it flows through the pn-junction and through the emitter structure. In this case, the conductivity modulation of the drift zone occurs. The conducting or transmission properties of the IGBT, however, deteriorate due to the shunt.

A reduction of the emitter efficiency of the emitter structure can be achieved in the case of an n-junction drift zone by increasing the dopant concentration in front of the pn-junction formed by drift zone and emitter structure. In this case, too, the conducting or transmission properties of the IGBT deteriorate.

It is also known to reduce the emitter efficient by employing an extremely thin contact as anode to the emitter structure, however, this is also associated with a deterioration of the conducting or transmission properties.

Finally, it has been proposed to reduce the life expectancy of the charge carriers in the drift zone by doping with heavy metals such as Au or Pt or by electron bombardment. The conducting or transmission properties, however, are thereby disadvantageously influenced. Moreover, this method cannot be utilized within the framework of an IC fabrication process since it involves disadvantageous influences on other integrated components.

These problems occur not only in the case of IGBTs but also in the case of other bipolar power components such as bipolar transistors or thyristors.

SUMMARY OF THE INVENTION

An object of the present invention is to provide a circuit structure having a bipolar power component with an emitter structure for conductivity modulation of a drift zone, which exhibits improved switching behavior in comparison to the prior art.

A further object of the invention is to specify a method for the operation of a bipolar power component with which the turn-off behavior of the bipolar power component is improved.

The above object is achieved in a circuit structure constructed in accordance with the principals of the present invention having at least one bipolar power component provided with an emitter structure, the emitter structure being surrounded by a drift zone of an opposite conductivity type which defines the voltage strength of the power component, with the emitter structure having a first contact and a drift zone having a second contact, the first and second contacts being disposed neighboring each other. The first and second contacts are connected to a driveable resistor circuit, which has a third contact and which is supplied with a control signal. Dependent on the control signal, the resistor circuit causes current to flow through the power component to the third contact either via the first contact, or via the second contact, or via the first contact and the second contact. The resistor circuit has a current/voltage characteristic with a curve in the region of the zero-axis crossing which substantially corresponds to the curve of the current/voltage characteristic of an ohmic resistor.

The above object is also achieved in a method for operating a bipolar power component having an emitter structure surrounded by a drift zone of the opposite conductivity type, the drift zone defining the voltage strength of the power component, including the steps of providing the emitter with a first contact and providing the drift zone with a second contact, providing a driveable resistor circuit having a voltage/current characteristic which corresponds substantially to that of an ohmic resistor in the region of the zero-axis crossing, the driveable resistor circuit having a third contact, and providing the resistor circuit with a control signal for causing current to flow through the power component to the third contact either via the first contact, or via the second contact, or via the first contact and the second contact.

According to the invention, the emitter structures are provided with a first contact and the drift zone is provided with a second contact. The first contact and the second contact are connected to a drivable resistor circuit that has a third contact. The drivable resistor circuit is designed such that the main current through the power component selectively flows to the third contact via the first contact, or via the second contact, or via the first contact and the second contact, dependent on a control signal that is applied to the drivable resistor circuit by a control electrode. The resistor circuit has a current/voltage characteristic with a curve in the region of the zero-axis crossing essentially corresponding to the curve of the current/voltage characteristic of an ohmic resistor.

The current/voltage characteristic is the voltage as a function of the current. When a voltage of zero volts is present at the resistor circuit, no current flows, and this means that the current/voltage characteristic covers the value (zero amperes, zero volts). In the region of this zero-axis crossing, the current/voltage characteristic of the resistor circuit proceeds essentially linearly.

The drivable resistor circuit can be a commutator in the context of the invention. In this case, the first contact is optionally connected to the third contact or the second contact is optionally connected to the third contact dependent on a control signal. Alternatively, the drivable resistor circuit can include a drivable switch between the second contact and the third contact, with the first contact directly connected to the third contact. When the switch is open, the main current in this case flows through the power component over the emitter structure, the first contact and the third contact. Essentially no voltage drop occurs between the first contact and the third contact. When the switch is closed, the main current in this case flows via the second contact to the third contact.

It is within the scope of the invention to employ transistors instead of switches that are switched on or off. In the case of a commutator, a transistor is connected between the first contact and the third contact and another transistor is connected between the second contact and the third contact, these respective transistors being driven by a control signal. The conductivity of the transistor is set dependent on the height of the control signal. It becomes possible in this way to set the conductivities of the two transistors connected parallel such that the main current is distributed onto the two branches in a prescribable ratio.

In the other example, only one transistor is connected between the second contact and the third contact. The first contact is directly connected to the third contact. In this example, too, the conductivity of the transistor can be set on the basis of the height of the control signal. The main current through the power component is distributed onto both branches dependent on the conductivity of the transistor.

Bipolar as well as MOS transistors can be employed in the drivable resistor circuit.

In the circuit structure of the invention, the main current through the bipolar power component flows via the pn-junction drift zone/emitter structure to the first contact or through the drift zone to the second contact dependent on a control signal. By applying a control signal, it is therefore possible in the circuit structure of the invention to switch the conductivity modulation on an off by injecting charge carriers via the pn-junction of the emitter structure/drift zone.

It is advantageous when activating the power component to drive the drivable resistor circuit such that a conductivity modulation in the drift zone occurs. When switching the power component off, by contrast, it is advantageous to shut the conductivity modulation off by conducting via the second contact. For specific applications, for example when decommuting a current flowing in a free running diode due to an inductance into the activated IGBT, it is advantageous to not abruptly activate the conductivity modulation and to conduct the main current through the power component in parallel via the first contact and via the second contact, at least at times.

It is especially advantageous to realize the circuit structure in a silicon substrate and to provide a dielectric insulation in the substrate with which the power component is insulated from the substrate and from the drivable resistor circuit. In this case, the space-charge zones in the power component are not subjected to any further influences and the outflow of charge carriers, or the charge carrier injection is dependent only on the electrical fields in the component and on the momentary values of resistance of the drivable resistor circuit. As a result, the conducting or transmission properties as well as the turn-off behavior of the power component can be driven in controlled fashion.

It is especially advantageous to form the dielectric insulation as a continuous, insulating layer that proceeds under the power component and under the drivable resistor circuit in the substrate and to form its vertical structure by means of a trench filled with insulating material that completely annularly surrounds the component. The drivable resistor circuit is also preferably annularly completely surrounded by such an insulating trench. The dielectric insulation can be especially simply realized in this way given the use of an SOI substrate. The power component and the resistor circuit are then realized in the single-crystal silicon layer of the SOI substrate and are respectively surrounded by an insulating trench.

The circuit structure can be especially advantageously employed for an IGBT. In this case, the power component has an $n^+$-doped source region that is surrounded by a p-doped channel region. The channel region thus adjoins the n-doped drift zone such that a current traverses the drift zone between the source region and the $p^+$-doped emitter structure. The IGBT further includes a cathode that is oriented at the surface of the source region and of the channel region and which shorts the source region and the channel region. The channel region is also provided with a gate dielectric at whose surface a gate electrode is arranged. The third contact of the drivable resistor circuit thereby forms an anode of the IGBT.

When the circuit structure comprises an IGBT used as a power component and when the IGBT and drivable resistor circuit are realized in a substrate with dielectric insulation, then the circuit structure forms a single, component at its exterior which has a cathode, an anode, a gate electrode for the IGBT and at least one control electrode for the drivable resistor circuit.

It is within the scope of the invention to provide MOS transistors in the drivable resistor circuit, the channel region of these MOS transistors proceeding in a zig zag pattern (serpentine)shape, folded or at the surface of the substrate.

DESCRIPTION OF THE PREFERRED EMBODIMENTS

Figure 1:
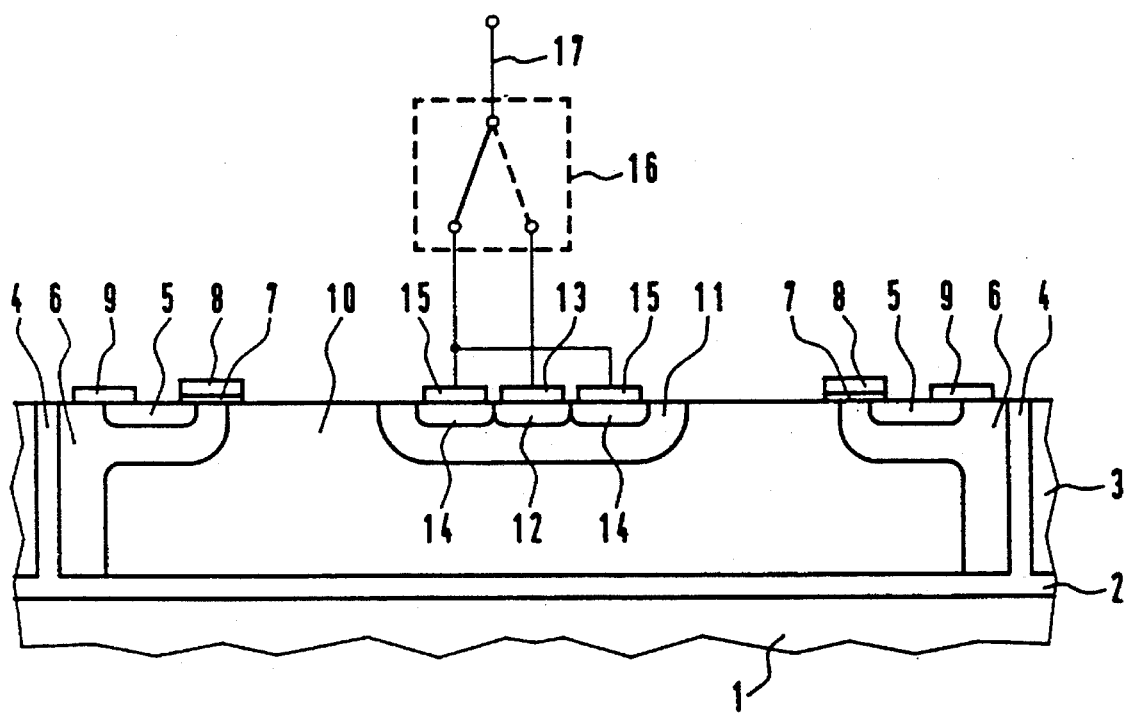
FIG. 1 shows an IGBT constructed and operating in accordance with the principles of the present invention, having an electric commutator.

An insulating layer 2 is arranged on a single crystal silicon wafer 1 and a single-crystal silicon layer 3 is arranged on the insulating layer 2 (see FIG. 1 ). The silicon wafer 1, the insulating layer 2 and the single-crystal silicon layer 3, for example, are component parts of an SOI substrate that is preferably manufactured according to the direct wafer bonding (DWB) method.

An insulating trench 4 that extends up to the insulating layer 2 is arranged in the single-crystal silicon layer 3. The insulation trench 4 annularly surrounds a region for an IGBT and is filled with insulating material.

An IGBT is formed within the region surrounded by the insulating layer 2 and by the insulation trench 4. The IGBT includes an $n^+$-doped source region 5 that is surrounded by an annular, p-doped region 6. The p-doped region 6 has a channel region for the IGBT. A gate dielectric 7 is arranged at the surface of the channel region of the p-doped region 6 and a gate electrode 8 is arranged on the gate dielectric 7.

A source electrode 9, that is also in contact with the p-doped region 6 at its side facing away from the channel region, is arranged at the surface of the source region 5. The source electrode 9, when connected as a cathode during operation of the IGBT, shorts the source region 5 to the p-doped region 6.

The $n^+$-doped source region 5 has a dopant concentration of, for example $10^{19}$ cm$^{-3}$. The p-doped region 6 has a dopant concentration of, for example, $2 \cdot 10^{17}$ cm$^{-3}$.

The p-doped region 6 adjoins a drift zone 10 that is n$^-$-doped and has a dopant concentration of, for example, $6 \cdot 10^{14}$ cm $^{-3}$. An n-doped island 11 having a dopant concentration of, for example $10^{17}$ cm$^{-3}$ is arranged in the middle of the drift zone 10. An emitter structure 12 that is $p^+$-doped is arranged in the n-doped island 11. The emitter structure 12 has a dopant concentration of, for example, $10^{19}$ cm$^{-3}$. A first contact 13 is arranged at the surface of the emitter structure 12.

An $n^+$-doped terminal region 14 is arranged neighboring the emitter structure 12. The $n^+$-doped terminal region 13 is completely arranged in the n-doped island 11 and, for example, annularly surrounds the emitter structure 12. A second contact 15 is arranged at the surface of the n +-doped terminal region 14. The first contact 13 and the second contact 15 are connected to a drivable resistor circuit 16. The drivable resistor circuit 16 has a third contact 17 that is connected as an anode during operation of the IGBT.

The drivable resistor circuit 16 is fashioned, for example, as a commutator in which, dependent on a control signal, the first contact 13 and the third contact 17, or the second contact 15 and the third contact 17, are connected. In applications wherein an additional series resistor between the emitter structure 12 and the anode 17 is to be avoided, it is advantageous to design the drivable resistor circuit 16 such that the first contact 13 is permanently connected to the third contact 17 and the second contact 15 is connected to the third contact 17 via a drivable switch. When the switch is opened, the current then flows thorough the emitter structure over the first contact 13. Given a closed switch, the current flows via the $n^+$-doped terminal region 14 and via the second contact 15 because of the pn-junction at the boundary surface between the emitter structure 12 and the n-doped island 11.

When the IGBT is turned on and during the activated condition, the first contact 13 is connected to the third contact 17, whereas the connection between the second contact 15 and the third contact 17 is interrupted. As a result thereof, maximum conductivity modulation with the fastest possible turn-on response and lowest possible turn-on voltage drop ($R_{On}$) is achieved by injection of charge carriers at the pn-junction between emitter structure 12 and n-doped island 11.

For turning the IGBT off, the connection between the third contact 17 and the first contact 13 is interrupted and the connection is produced between the third contact 17 and the second contact 15. As a result, the charge carrier injection from the emitter structure 12 is suddenly interrupted. The charge injected into the drift zone 10 during the activated condition is dismantled as quickly as possible by flowing off over the $n^+$-doped terminal region 14 and the second contact 15.

In the deactivated condition of the IGBT, the second contact 15 remains connected to the third contact 17 in order to achieve maximum blockability. In this arrangement, the diode formed of the p-doped region 6 and the n-doped drift zone 10 defines the blocking behavior. The $p^+$-doped emitter structure 12 has no influence on the blocking capability of the IGBT in this operating condition.

The specific IGBT advantages of the structure are present as long as the first contact 13 is connected to the third contact 17. When the third contact 17 is connected to the second contact 15, then the circuit structure of the invention is operated in an "MOSFET" mode and has the properties of a DMOS transistor.

By applying a corresponding control signal, the circuit structure is optionally operated in an IGBT mode or a MOSFET mode, dependent on which properties are required for the circuit.

When a maximum anode current is upwardly exceeded, latching of the IGBT can in fact occur in the circuit structure of the invention; the thyristor thereby triggered, however, can be disconnected in controlled fashion by separating the connection between the third contact 17 and the first contact 13 and by connecting the third contact 17 to the second contact 15.

The additional, drivable resistor circuit 16 is realized in the circuit structure of the invention preferably by being integrated outside the insulation trench 4. The dielectric insulation of the IGBT assures that the charge flow, or the charge carrier injecting, ensues in controlled fashion via the first contact 13 or the second contact 15.

By comparison to the standard IGBT without a drivable resistor circuit, the circuit structure of the invention requires a larger area. This increased area requirement, however, is partially compensated by virtue of the IGBT in the circuit structure of the invention exhibiting a higher current-carrying capability due to the better conducting or transmission properties. The $n^+$-doped terminal region 14, moreover, can be dimensioned such that the diode formed by p-doped region 6/drift zone can be used as a free running diode. The area requirement for a highly inhibiting free running diode additionally required in many circuit is then eliminated. By designing a drivable resistor circuit having an area requirement that is smaller than that of a free running diode, the circuit structure of the invention can be realized with a lower area requirement than a conventional IGBT arrangement.

Figure 2:
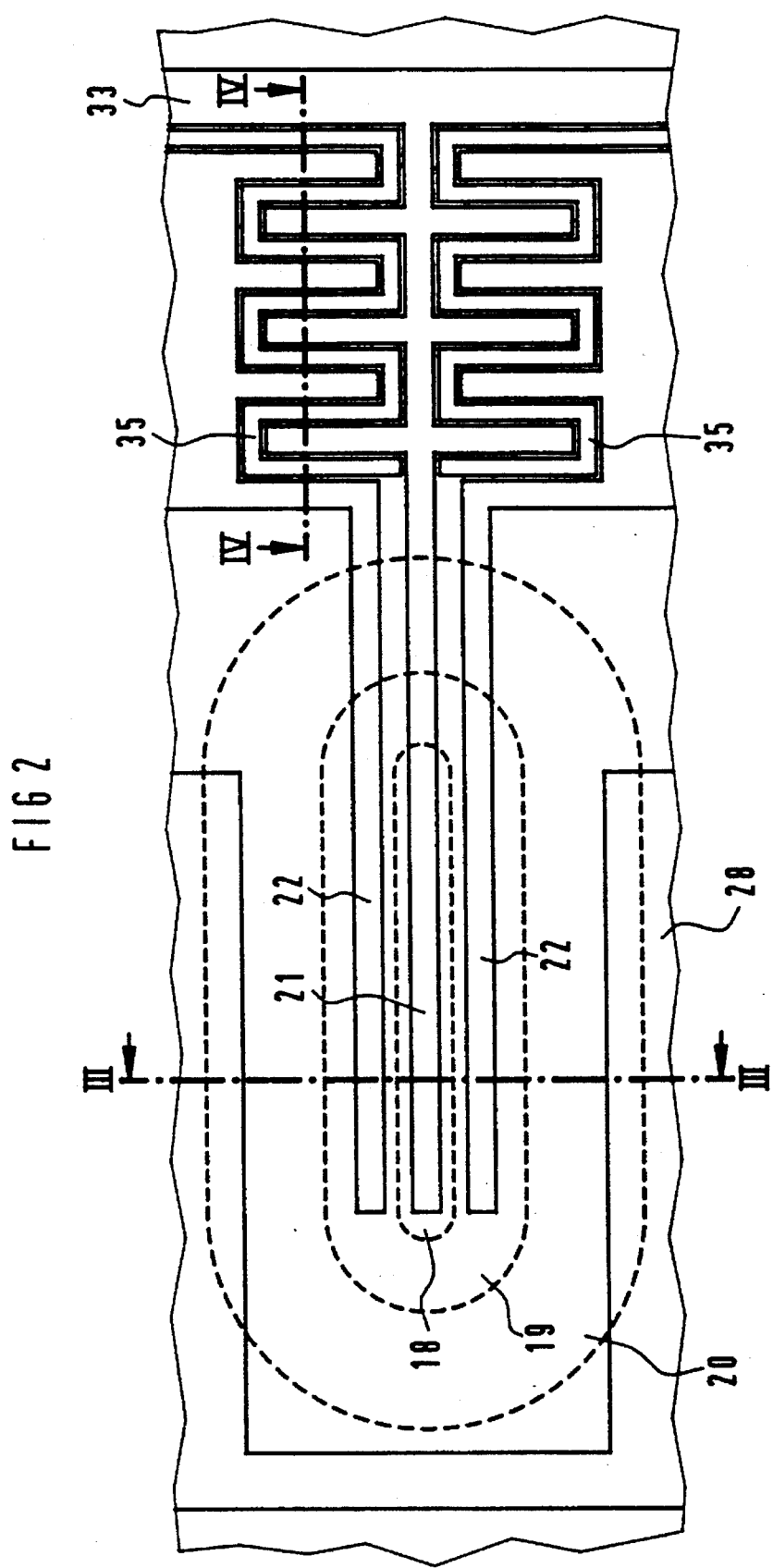
FIG. 2 shows an IGBT constructed and operating in accordance with the principles of the present invention, having a drivable resistor circuit that comprises an MOS transistor with folded channel region.

FIG. 2 shows a plan view of a circuit structure of the invention. Dashed lines indicate the position of a $p^+$-doped emitter structure 18, an $n^+$-doped terminal region 19 and an $n^-$drift zone 20. The emitter structure 18 has a dopant concentration of, for example, $10^{19}$ cm$^{-3}$, the terminal region 19 has a dopant connection of, for example, $10^{19}$ cm$^{-3}$ and the drift zone has a dopant concentration of, for example, $6 \cdot 10^{14}$ cm$^{-3}$.

The emitter structure 18 is connected to a first contact 21 that proceeds above the emitter structure 18. The $n^+$-doped terminal region 19 that annularly surrounds the emitter structure 18 at the surface is provided with two second contacts 22. The second contacts 22 proceed parallel to the first contact 21 above the $n^+$-doped terminal region.

Figure 3:
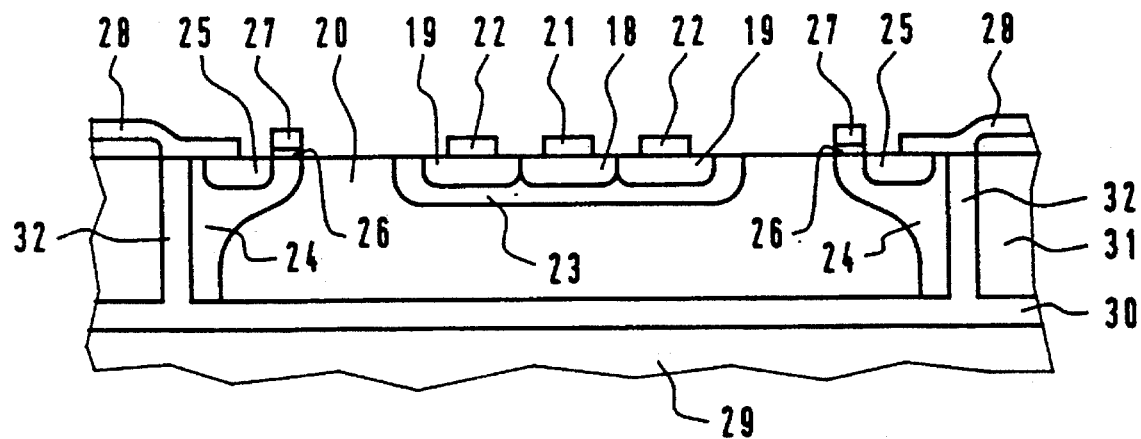
FIG. 3 shows a section through the IGBT referenced III—III in FIG. 2.

FIG. 3 shows the section through the circuit structure of the invention referenced III—III in FIG. 2. The emitter structure 18 and the terminal region 19 are arranged in an n-doped island 23 that is in turn arranged in the drift zone 20. The drift zone 20 adjoins a p-doped region 24 that surrounds a channel region of the IGBT. The p-doped region 24 has a dopant concentration of, for example, $2 \cdot 10^{17}$ cm$^{-3}$. An $n^+$-doped, annular source region 25 is arranged in the p-doped region 24. A gate dielectric 26 is arranged at the surface of the channel region and a gate electrode 27 is arranged on said gate dielectric 26. The gate dielectric 27 is not shown in the plan view of FIG. 2 for the sake of clarity. The source region 25 and the p-doped region 24 are connected to one another via a cathode 28 arranged at the surface, at that side of the source region 25 facing away from the channel region.

The IGBT is realized in an SOI substrate that has a single-crystal silicon wafer 29, an insulating layer 30 arranged thereon and a single-crystal silicon layer 31 arranged on the insulating layer 30. The IGBT is formed in the silicon layer 31. It is completely surrounded by an insulation trench 32 which extends up to the surface of the insulating layer and which is filled with insulating material.

Figure 4:
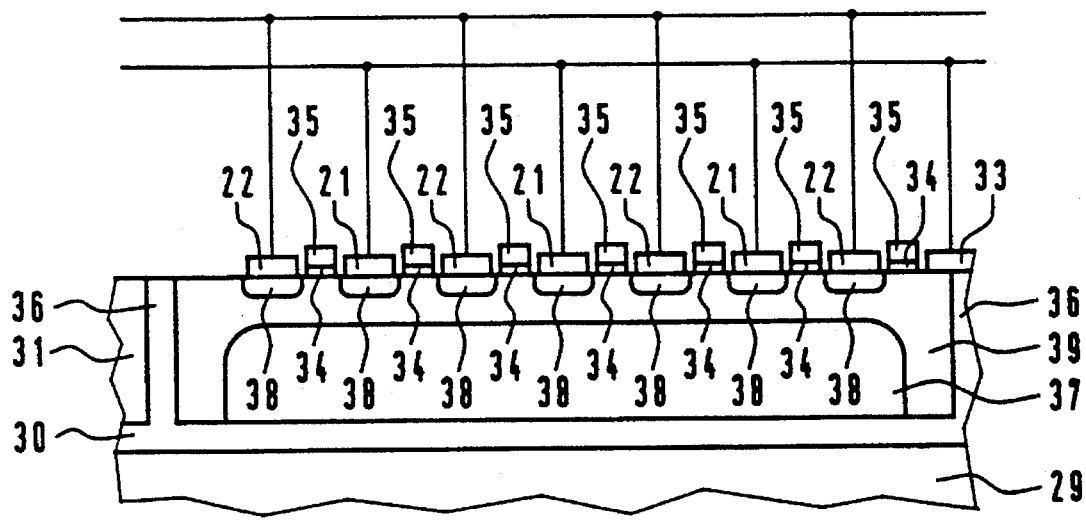
FIG. 4 shows a section thorough the drivable resistor circuit referenced IV—IV in FIG. 2.

A drivable resistor circuit is formed in the silicon layer 31 outside the insulation trench 32 (see FIG. 2 and the section in FIG. 4 referenced IV—IV). The drivable resistor circuit is realized as an MOS transistor pair of, for example, the n-channel type, whereby the drain region is interconnected with the first contact 21 and a third contact 33 that is switched as an anode during operation of the circuit structure, and the source region is connected to one of the second contacts 22. The source and drain regions of each MOS transistor thereby encompass a respective comb-shaped region wherein ridges arranged parallel to one another adjoin a connecting part proceeding perpendicularly relative thereto. The metalization of the one of the source or drain regions connected to the first contact 21, and of the other connected to the second contact 22, likewise exhibits this comb-shaped structure. The comb-shaped regions of source and drain region are arranged such relative to one another that the ridges of source and drain regions respectively engage interdigitally into one another with the ridges of the source region and the ridges of the drain region arranged in alternation, so that the channel region of the MOS transistor proceeds folded in a serpentine path around the ridges. A gate dielectric 34 and a gate electrode 35 are arranged above the channel region. The gate electrode 35 follows the folded course of the channel region (see FIG. 2).

The MOS transistor pair is preferably annularly surrounded by an insulation trench 36 (see FIG. 4). The insulation trench 36 extends to the surface of the insulating layer 30 and is filled with insulating material. An $n^-$-doped region is arranged inside the insulation trench 36 at the boundary surface to the insulating layer 30. The $n^+$-doped source/drain regions 38 are surrounded by a p-doped well region 39.

As long as the MOS transistor pair in this exemplary embodiment inhibits, the main current flows through the IGBT via the pn-junction of the emitter structure 18, the first contact 21 and the third contact 33. When, by contrast, the MOS transistor pair is driven by the gate electrodes 34 such that it becomes conductive and the voltage drop across the MOS transistor is lower than the threshold voltage of the pn-junction of the emitter structure 18, then the main current flows through the IGBT via the second contact 22 into the MOS transistor to the third contact 33. The resistance of the MOS transistor in the conductive condition and, thus the voltage drop across the MOS transistor, is set via the height of the control signal at the gate electrode 35. The main current can flow selectively be distributed via the first contact 21 and the second contact 22 to the third contact 33 as a result of the control signal at the gate electrode. This, for example, is advantageous for a half-bridge circuit having an IGBT of the invention in the upper and lower bridge part. The lower IGBT thereby has its cathode at ground and the upper IGBT has its anode connected to a positive supply voltage. A load circuit inductance is located between the center point of the half-bridge and the supply voltage. Both IGBTs are connected in the MOSFET or in the diode mode. The current from the inductance flows in a backward direction into the upper IGBT which acts as a free running diode. When the lower IGBT is activated faster than the stored charge has flowed from the upper IGBT, a nearly unlimited current flows across the two IGBTs and usually leads to the destruction of at least one of the two components. In order to prevent this, the lower IGBT can first be switched in the MOSFET mode and can be switched into the IGBT mode only after the stored charge has flowed off from the upper IGBT.

Figure 5:
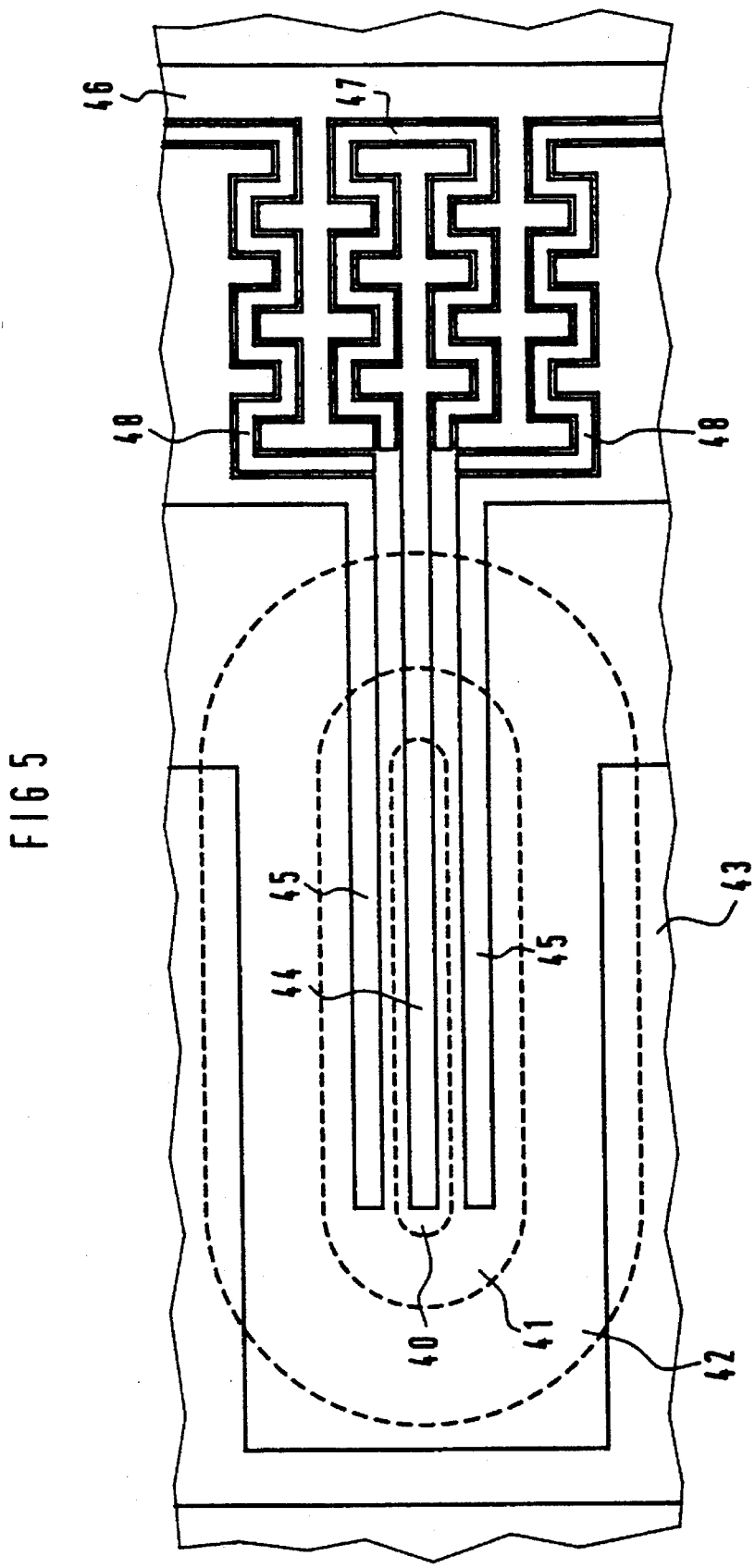
FIG. 5 shows a plan view of an IGBT constructed and operating in accordance with the principles of the present invention, having a drivable resistor circuit that has two MOS transistors with folded channel region.

FIG. 5 shows a further exemplary embodiment of a circuit structure of the invention. The embodiment includes an IGBT having a $p^+$-doped emitter structure 40, an $n^+$-doped terminal region 41 surrounding said emitter structure 40, and an $n^-$-doped drift zone 42. The emitter structure 40, the terminal region 41 and the drift zone 42 are shown with dashed lines in FIG. 5. The drift zone 42 is adjacent to a p-doped region that forms the "body" of the IGBT and encompasses a channel region for the IGBT. An $n^+$-doped source region is embedded in the p-doped region. A gate dielectric is provided in the region of the channel region and a gate electrode is provided on this gate dielectric. The p-doped region, source region, gate dielectric and gate electrode are not shown in FIG. 5 clarity. The source region and the p-doped region are contacted via a cathode 43.

The emitter structure 40 is connected via a first contact to a first interconnect 44. The n⁺-doped terminal region 41 is connected via second contacts to a second interconnect 45. The IGBT is realized in the single-crystal silicon layer of an SOI substrate and is completely surround by an insulation trench that extends to the surface of the insulating layer of the SOI substrate. A drivable resistor circuit is realized in the silicon layer outside the insulating trench surrounding the IGBT, this drivable resistor circuit being likewise completely surrounded by an insulation trench. The drivable resistor circuit is connected via a third contact to a third interconnect 46 that is switched as an anode during operation of the circuit structure.

The drivable resistor circuit has a first MOS transistor that is connected between the first interconnect 44 and the third interconnect 46. The drivable resistor circuit further includes second MOS transistors that are respectively connected between the second interconnects 45 and the third interconnect 46. All MOS transistors have comb-shaped source/drain regions having parallel ridges and a connecting part proceeding perpendicularly thereto. Comb-shaped regions of an MOS transistor are arranged such that the ridges of the source and drain regions respectively engage interdigitally into one another with the ridges of the source region and the ridges of the drain region arranged in alternation, so that the channel region of the MOS transistor proceeds folded in a serpentine path around the ridges. A gate electrode 47 that follows the folded course of the channel region is arranged above the channel region of the first MOS transistor. A second gate electrode 48 is arranged above the channel regions of the second MOS transistors, each gate electrode 48 likewise following the course of the folded channel regions.

By means of a corresponding drive of the first gate electrode 47 and/or of the second gate electrode 48, the first interconnect 44 in this exemplary embodiment is connected to the third interconnect 46, or the second interconnects 45 are connected to the third interconnect 46. In this embodiment, the current flows through the IGBT both between the first contact and the third contact and between the second contact and the third contact, each current path respectively occurring via a conductive MOS transistor.

Figure 6:
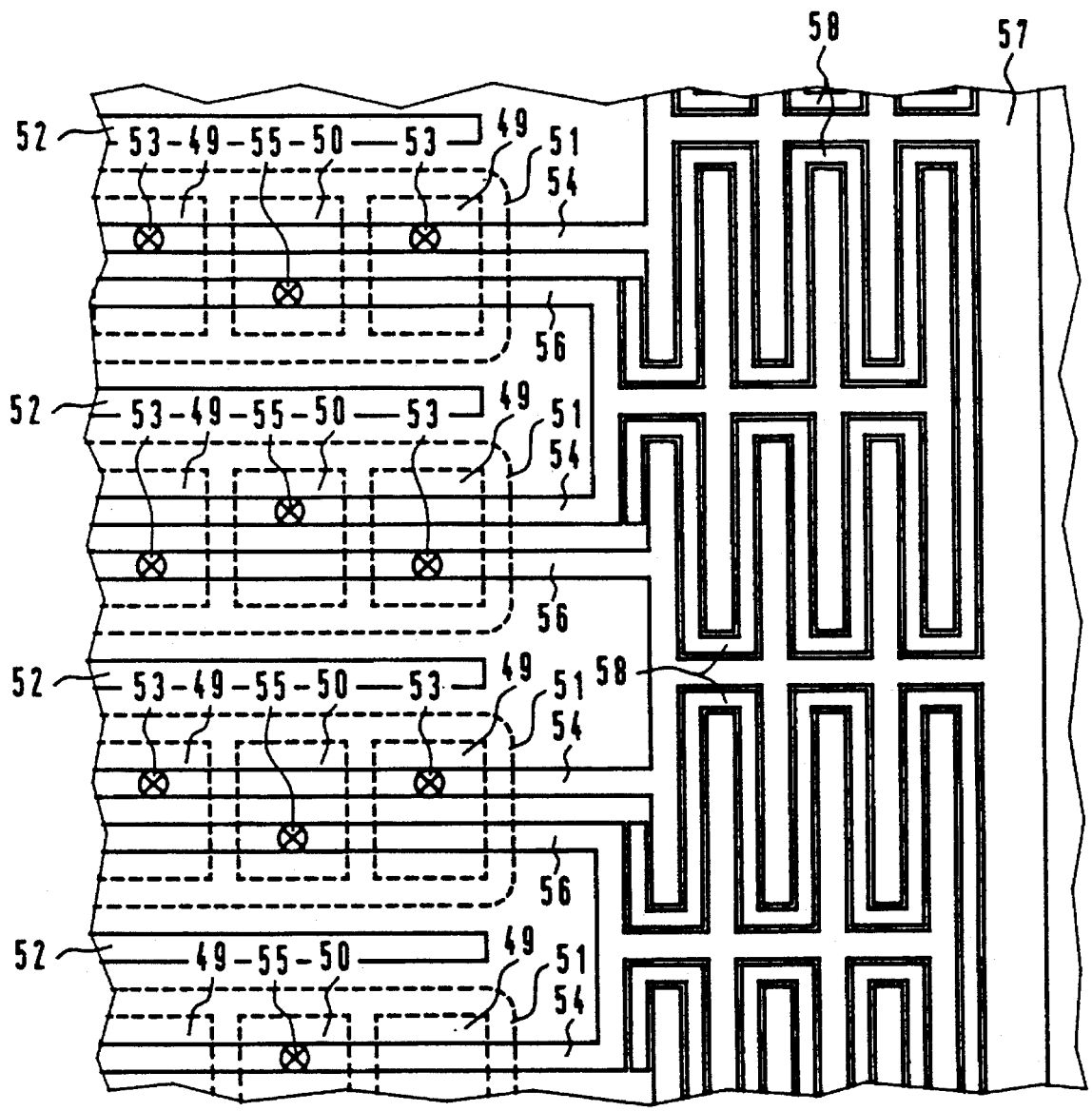
FIG. 6 shows a plan view of an IGBT constructed and operating in accordance with the principles of the present invention, with drivable resistor circuit with an interconnect for an $n^+$-contact and an interconnect for a $p^+$-contact.

An exemplary embodiment wherein only two interconnects for respectively contacting an n⁺-doped region or a p⁺-doped region are required in the region of the IGBT shall be set forth below with reference to FIG. 6.

In the exemplary embodiments described with reference to FIG. 2 and to FIG. 5, the IGBT is realized in a single-crystal silicon layer of an SOI substrate. The IGBT is thereby completely surrounded by an insulation trench that extends to the surface of the insulating layer of the SOI substrate. The drivable resistor circuit is likewise realized in the single-crystal silicon layer of the SOI substrate and is surrounded by a further insulation trench that extends to the insulating layer.

The IGBT has p⁺-doped emitter structures 49 that are arranged adjacent to n⁺-doped terminal regions 50 in alternation. The number of emitter structures 49 and terminal regions 50 arranged adjacent to one another is selected based on the current-carrying capability of the IGBT required for the employment of the circuit structure. The emitter structures 49 and the n⁺-doped terminal regions 50 are surrounded by n⁻-doped drift zones 51. Moreover, the IGBT is constructed according to the same principle as set forth with reference to FIG. 2 and to FIG. 5. The source region and the body are shorted via a cathode 52. In FIG. 6, only parts of the cathode 52 are visible that are connected to a cathode rail outside the drawing excerpt.

The emitter structures 49 are connected to a first interconnect 54 via a first contact 53. The n⁺-doped terminal regions 50 are connected to a second interconnect 56 via second contacts 55.

The first interconnect is directly connected to a third interconnect 57 that is switched as an anode during operation of the circuit structure. The drivable resistor circuit has an MOS transistor structure that is connected between the first interconnect 54 and the second interconnect 56. As in the exemplary embodiment set forth with reference to FIG. 2, the source/drain regions of the MOS transistor structure are fashioned comb-shaped and are respectively arranged relative to one another such that the ridges of source and drain region engage into one another in alternation. The channel region of the MOS transistor proceeds folded around the ridges. Gate electrodes 58 are arranged above the folded channel regions, these gate electrodes 58 following the folded course of the channel regions and being connected to one another outside the plane of the plan view. As a result of an appropriate drive of the gate electrode 58, the MOS transistor structure becomes conductive, so that the main current through the IGBT flows via the second contact 55 and the second interconnect 56 to the third interconnect 57. The p⁺n-junction at the emitter structures 49 prevents the main current from flowing via the first contacts 53 and the first interconnect 54 to the third interconnect 57 as long as the voltage drop-off across the MOS transistor structure is less than 0.5 volts. As long as the MOS transistor structure inhibits, however, the main current in the IGBT flows via the first contacts 53 and the first interconnects 54 to the third interconnect 57.

Two neighboring emitter structure 49/terminal region 50 sequences arranged line-shaped form a periodically repeatable basic unit in this circuit structure. The number of such basic units which are joined to one another is dependent on the demands made by the employment of the circuit structure.

In the exemplary embodiments set forth with reference to FIGS. 2, 5 and 6, the drivable resistor circuit have at least one MOS transistor. The gate electrodes of these MOS transistors have been respectively shown in the same plane as the interconnects in the FIGS. In the realization of the circuit structure of the invention, the gate electrodes can be arranged in different levels than the interconnects; in particular, the gate electrodes can be realized as buried gate electrodes. Combinations of the various source electrodes or drain electrodes of the MOS transistors in the drivable resistor circuit can be formed by different metalization levels.

Although modifications and changes may be suggested by those skilled in the art, it is the intention of the inventors to embody within the patent warranted hereon all changes and modifications as reasonably and properly come within the scope of their contribution to the art.

I claim as my invention:

1. A circuit structure comprising:
   a bipolar power component having an emitter structure, said emitter structure being of a first conductivity type;
   a drift zone surrounding said emitter structure and defining a voltage strength of said power component, said drift zone being of a second conductivity type opposite to said first conductivity type;
   a first contact electrically connected to said emitter structure;

a second contact electrically connected to said drift zone, said first and second contacts neighboring each other;

control signal-responsive driveable resistor circuit means having a third contact for, in response to a control signal, causing current to flow through said power component to said third contact either via said first contact, via said second contact, or via said first and said second contact; and said control signal-responsive driveable resistor circuit means having a current/voltage characteristic with a curve having a zero-axis crossing and said curve in the region of said zero-axis crossing corresponding substantially to a curve of the current/voltage characteristic of an ohmic resistor.

2. A circuit structure as claimed in claim 1 further comprising:

a silicon substrate on which said bipolar power component and said control signal-responsive driveable resistor means are integrated; and a dielectric insulation layer in said substrate insulating said power component from said substrate and from said control signal-responsive driveable resistor circuit means.

3. A circuit structure as claimed in claim 2 wherein said drift zone comprises a terminal region having an elevated dopant concentration of said second conductivity type, said second contact being disposed on said terminal region.

4. A circuit structure as claimed in claim 2 wherein said power component comprises an $n^+$-doped source region surrounded by a p-doped channel region, said channel region adjoining said drift zone for causing a current between said source region and said emitter structure to traverse said drift zone, and the circuit structure further comprising a cathode which shorts said source region to said channel region, said channel region having a gate dielectric with a surface and a gate electrode disposed at said surface, and wherein said third contact forms an anode of said power component.

5. A circuit structure as claimed in claim 1 wherein said control signal-responsive driveable resistor circuit means comprises a transistor connected between said second contact and said third contact and said transistor exhibiting variable conductivity between said second contact and said third contact, said transistor having a control electrode supplied with a control signal for varying said conductivity between said second contact and said third contact, and wherein said first contact is directly connected to said third contact.

6. A circuit structure as claimed in claim 5 wherein said transistor comprises an MOS transistor having a source region and a drain region, wherein said source region and said drain region respectively comprise comb-shaped regions each having parallel ridges connected by a connecting part proceeding perpendicularly to said parallel ridges, said comb-shaped region of said source region and said comb-shaped region of said drain region being disposed so that the ridges of said source region and the ridges of said drain region engage each other interdigitally in alternation and thereby forming a channel region of said MOS transistor proceeding in a serpentine path around said ridges of said source and drain regions, said drain region being connected to said first contact and said source region being connected to said second contact.

7. A method for operating a bipolar power component having an emitter structure of a first conductivity type surrounded by a drift zone of a second conductivity type opposite to said first conductivity type, said drift zone defining a voltage strength of said bipolar power component, comprising the steps of:

providing said emitter structure with a first contact and providing said drift zone with a second contact;

providing a control-signal driveable resistor circuit having a third contact and providing said control signal-responsive resistor circuit with a voltage/current characteristic having a curve with a zero crossing which is substantially the same in a region of said zero-crossing as the voltage/current characteristic curve of an ohmic resistor; and supplying a control signal to said control signal-responsive driveable resistor circuit for causing said driveable resistor circuit to direct current through said power component to said third contact either via said first contact, via said second contact, or via said first contact and said second contact.

8. A method as claimed in claim 7 wherein the step of providing a control signal-responsive driveable resistor circuit comprises providing a transistor as said driveable resistor circuit with a variable conductivity between said second contact and said third contact, and supplying said control signal to a control electrode of said transistor for varying said conductivity between said second contact and said third contact, and directly connecting said first contact to said third contact in parallel with said transistor.

9. A method as claimed in claim 7 comprising the step of driving said control signal-responsive driveable resistor circuit when said bipolar power component is turned on for causing said current to flow through said power component to said third contact via said first contact, and driving said control signal-responsive driveable resistor circuit for switching said power component off to cause said current to flow through said bipolar power component via said second contact.

* * * * *